(12) United States Patent
Michaeli et al.

(10) Patent No.: US 6,309,983 B1
(45) Date of Patent: Oct. 30, 2001

(54) LOW TEMPERATURE SACRIFICIAL OXIDE FORMATION

(75) Inventors: Alexander Michaeli, Wappingers Falls; Stephan Kudelka, Fishkill, both of NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/324,926

(22) Filed: Jun. 3, 1999

(51) Int. Cl.[7] .................................................... H01L 21/31
(52) U.S. Cl. ......................... 438/788; 438/525; 438/592; 438/744; 438/745
(58) Field of Search ................................. 458/164, 302, 458/525, 592, 745, 744, 788

(56) References Cited

U.S. PATENT DOCUMENTS 5,928,968 * 7/1999 Bothra et al. ........................ 438/745
6,074,900 * 6/2000 Yamazaki et al. .................... 438/164

* cited by examiner

Primary Examiner—David Nelms
Assistant Examiner—Renee' R. Berry

(57) ABSTRACT

A method for depositing a sacrificial oxide for fabricating a semiconductor device includes preparing p-doped silicon regions on a semiconductor wafer for depositing a sacrificial oxide on the p-doped silicon regions. The method also includes the step of placing the wafer in an electrochemical cell such that a solution including electrolytes interacts with the p-doped silicon regions to form a sacrificial oxide on the p-doped silicon regions when a potential difference is provided between the wafer and the solution. Processing the wafer using the sacrificial oxide layer is also included.

26 Claims, 4 Drawing Sheets

LOW TEMPERATURE SACRIFICIAL OXIDE FORMATION

BACKGROUND

1. Technical Field

This disclosure relates to semiconductor fabrication and more particularly, to the formation of oxides in semiconductor fabrication.

2. Description of the Related Art

Semiconductor memory devices, such as dynamic random access memories (DRAM's) include capacitors accessed by transistors to store data. Deep trench (DT) capacitors are among the types of capacitors used in DRAM technology. Deep trench capacitors are typically buried within a semiconductor substrate.

Processing of semiconductor devices such as DRAM's requires formation and subsequent removal of sacrificial films such as $SiO_2$ which are called sacrificial oxides (SacOx). These SacOx films may have different uses, such as 1. surface protection, e.g., during implantation, or etch processes (e.g., prior to gate oxide formation);
2. stress relief film (e.g., Pad Oxide);
3. etch stop layer (e.g., Pad Oxide);
4. smoothing of the surface (e.g., SacOx in deep trenches);
5. masking layers (e.g. metal hard mask with subsequent oxidation);
6. structure formation (Poly Pillar formation within deep trenches, DT bottle shape formation); and
7. channeling inhibition during ion implantation.

The conventional thermal SacOx formation suffers from at least some the following drawbacks:

1. High temperatures, up to 1050 ?C., are required. This significantly contributes to the thermal process budget and may cause stress at device interfaces resulting in dislocations. These dislocations may e.g. cause variable retention time (VRT) problems.
2. The oxide thickness of high temperature SacOx. shows a severe dependence on the Si-crystal orientation resulting in nonuniform structures if polycrystalline surfaces such as trench sidewalls are involved.
3. Thermal SacOx thickness measurement and control are needed. Conventionally the SacOx thickness is measured on the surface of monitor wafers, i.e. an indirect measurement is performed which has to be correlated to the actual structure. If the surface has a different crystal orientation or is polycrystalline (e.g., trench sidewalls), this results in significant deviations between measurement and actual thickness (poor control).
4. Thermal oxides show a high density and are therefore relatively resistant to wet etches. The removal of thermal oxides therefore often results in an undesired attack (degradation) of exposed device surfaces.
5. To obtain homogeneous SacOx thicknesses across wafers, a high temperature uniformity is required resulting in the need for high quality furnaces which are expensive.

Therefore, a need exists for a method for forming a sacrificial oxide which does not suffer from the disadvantages of conventional processes. A further need exists for providing a sacrificial oxide process without significant impact to a thermal processing budget.

SUMMARY OF THE INVENTION

A method for depositing a sacrificial oxide for fabricating a semiconductor device includes the steps of preparing p-doped silicon regions on a semiconductor wafer for depositing a sacrificial oxide on the p-doped silicon regions, placing the wafer in an electrochemical cell such that a solution including electrolytes interacts with the p-doped silicon regions to form a sacrificial oxide on the p-doped silicon regions when a potential difference is provided between the wafer and the solution, and processing the wafer using the sacrificial oxide layer.

Another method, in accordance with the present invention, for electrochemically forming a sacrificial oxide includes the steps of exposing p-doped portions of a silicon substrate, placing the silicon substrate in an electrochemical cell, the electrochemical cell including a solution having electrolytes dissolved therein, applying a first potential to the silicon substrate and a second potential to the solution to form a potential difference therebetween such that a sacrificial oxide layer is electrochemically deposited on the exposed p-doped regions of the substrate, processing the wafer using the sacrificial oxide layer and removing the sacrificial oxide layer.

In alternate methods, the step of applying a voltage between the wafer and the solution to create the potential difference such that the voltage applied controls the thickness of the sacrificial oxide may be included. The solution preferably includes water and the electrolyte preferably includes an ionic compound. The step of placing the wafer in an electrochemical cell may include the steps of placing the wafer in an electrochemical cell such that the wafer has an exposed surface area including the exposed p-doped silicon regions thereon and providing a counter electrode in the solution having a substantially same exposed surface area as the exposed surface area of the wafer.

The step of placing the wafer in an electrochemical cell may include the step of sealing other than exposed areas of the wafer to prevent contact with the solution. The step of placing the wafer in an electrochemical cell may include the step of placing the wafer in an electrochemical cell such that a front surface of the wafer including the exposed p-doped silicon regions is exposed to an anodic or electrochemical oxidation and a back surface of the wafer is exposed to a second solution which transfers a potential to the wafer to cause the potential difference. The solution including electrolytes preferably interacts with the p-doped silicon regions by reacting according to the reaction:

$$Si + H_2O \rightarrow SiO_2 + 4H^+ + 4e^-$$ (EQ. 1).

The reaction preferably occurs at about room temperature. The step of processing may include the steps of etching a trench in a substrate of the semiconductor wafer wherein the surface has a first smoothness, forming the sacrificial oxide layer in the trench, and etching the sacrificial oxide layer to form a surface smoother than the first smoothness. The step of processing may alternately include the steps of forming the sacrificial oxide layer on a surface of a substrate of the semiconductor wafer, and shielding portions of the surface from dopants using the sacrificial oxide layer. The step of processing may include the steps of etching a trench in a substrate of the semiconductor wafer, forming an oxide region in the trench, etching the oxide region to expand the trench. The step of adjusting a thickness of the sacrificial oxide by adjusting th e potential difference may also be included. The step of processing may include the steps of etching a trench in a substrate of the semiconductor wafer wherein the surface has a first smoothness and forming the sacrificial oxide layer in the trench. The step of removing may include the step of etching the sacrificial oxide layer to form a surface smoother than the first smoothness.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly to forming a low temperature sacrificial oxide. The present invention provides for a sacrificial oxide which is advantageously formed using an anodic oxidation of silicon in a conducting electrolyte according to an electrochemical reaction. Although described by way of example for sacrificial oxide formation, the present invention is much broader and is applicable to any electrochemical deposition for semiconductor devices.

The present invention forms a sacrificial oxide (SacOx) layer by employing an electrochemical process. The present invention preferably forms the SacOx by an anodic oxidation in a conducting electrolyte. An illustrative electrochemical reaction may include:

$$Si+H_2O \rightarrow SiO_2+4H^++4e^-$$ (EQ. 1)

In a preferred embodiment, p-type doped silicon is employed since oxides do not readily grow on n-type doped silicon (dark silicon). In one embodiment, a reaction rate of EQ. 1 is controlled by an electric field (high field mechanism) within an oxide which forms the SacOx. In this way, a uniform thickness for the SacOx may be achieved by controlling the applied anodic voltage. In preferred embodiments, a growth factor is about 1.5 nm per volt, i.e. 20 V leads to an 30 nm thick oxide film. The reaction preferably takes place at room temperature, however other temperatures may be employed to control the rate of reaction.

Advantageously, in accordance with the present invention, anodic oxides show a lower density than thermal oxides resulting in much higher etch rates and therefore better selectivities to adjacent layers (etch rates may be about 6 times higher or greater than selectivities for thermal oxides). In the case that the higher selectivity is not beneficial, an anneal in the temperature range between 400° C. and 800° C. can be performed after anodization resulting in oxide densities which are similar to the ones of thermal oxides. Even with an anneal, the thermal budget still remains significantly below the thermal budget needed for conventional thermal oxidation (above 1000° C. for thermal oxidation).

Figure 1:
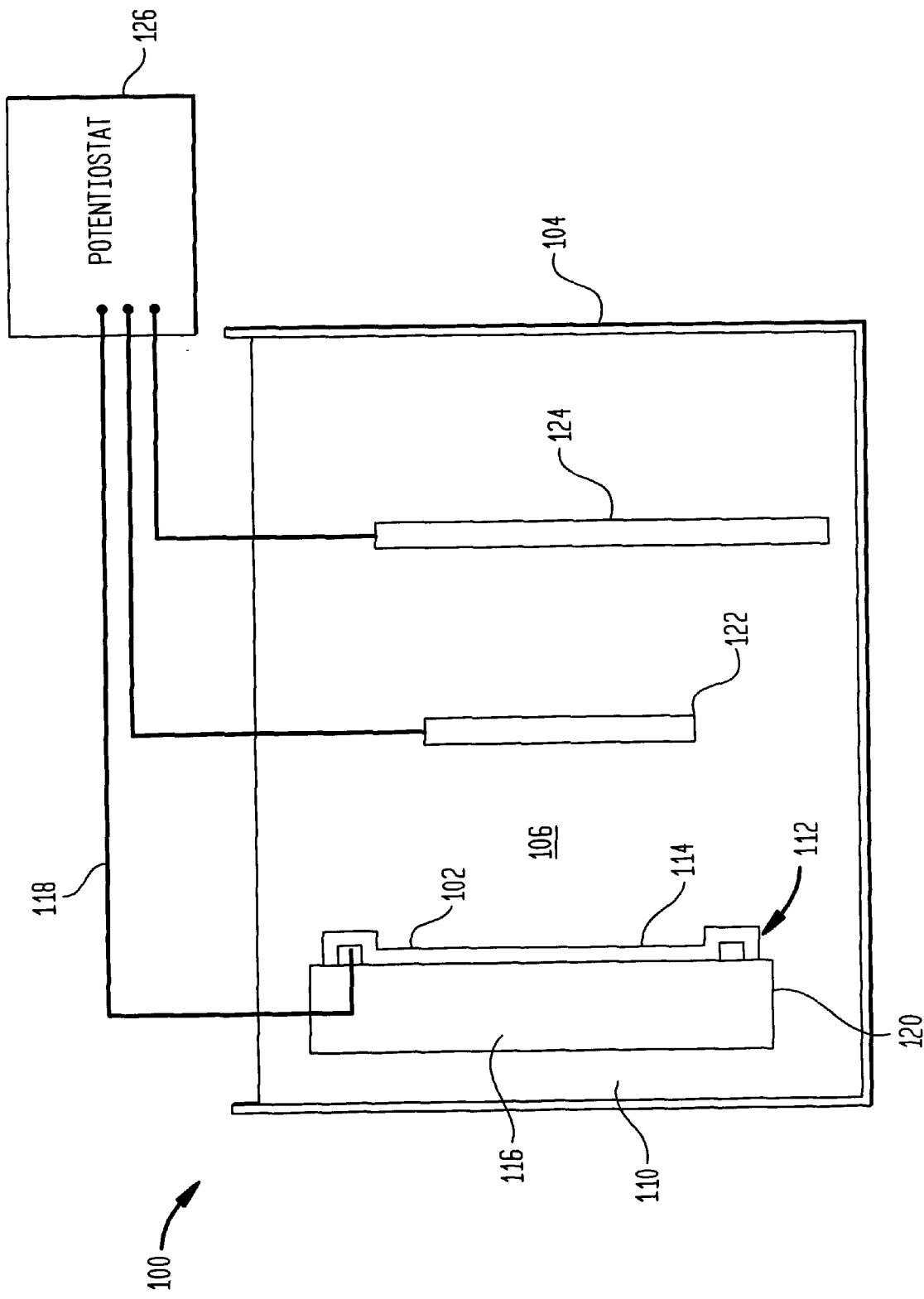
FIG. 1 is a schematic diagram of an apparatus for electrochemically forming an oxide in accordance with the present invention

Referring now in specific detail to the drawings in which like reference numerals identify similar or identical elements throughout the several views, and initially to FIG. 1, an apparatus 100 is shown for applying a voltage for controlling electrochemical oxide formation on a substrate/wafer 102 (hereinafter wafer 102) in accordance with the present invention. Apparatus 100 is an electrochemical cell which includes a bath 104 which is filled with a liquid 106 including an electrolyte. Liquid 106 is preferably water and the electrolyte may include ionic compounds such as salts, acid compounds, base compounds, etc. or a combination thereof. In one embodiment, the electrolyte includes $H_2SO_4$ having a normality of between about 0.001 N and about 1 N. Other compounds and concentrations are contemplated and may be provided such that ions are capable of transfer between electrodes in bath 104.

Wafer 102 is secured to an isolating wafer holder 110. Clamps 112 are provided about a periphery of wafer 102 to both secure and seal wafer 102 such that only an upper face 114 of wafer 102 is exposed to liquid 106 in bath 104. Electrical contact is made to wafer 102 on a backside 116 through a conductive wire 118. A conductive film or foil 120 may be disposed between holder 110 and wafer 102 to improve electrical contact between wire 118 and wafer 102. A reference electrode 122 is included in bath 104 to maintain a predefined potential in liquid 106. A counter electrode 124 is also included. Counter electrode 124 preferably includes at least the same amount of exposed surface area as wafer 102. This provides more uniform thickness control by more symmetrically distributing ion flow in bath 104. A voltage source or potentiostat 126 is included for providing a voltage difference between wafer 102 and reference electrode 122. This voltage difference is used to control the thickness of oxide deposited on wafer 102 as described above. Advantageously, exposed p-doped silicon areas on wafer 102 react such that the oxide formation occurs only over the exposed p-doped silicon areas.

Figure 2:
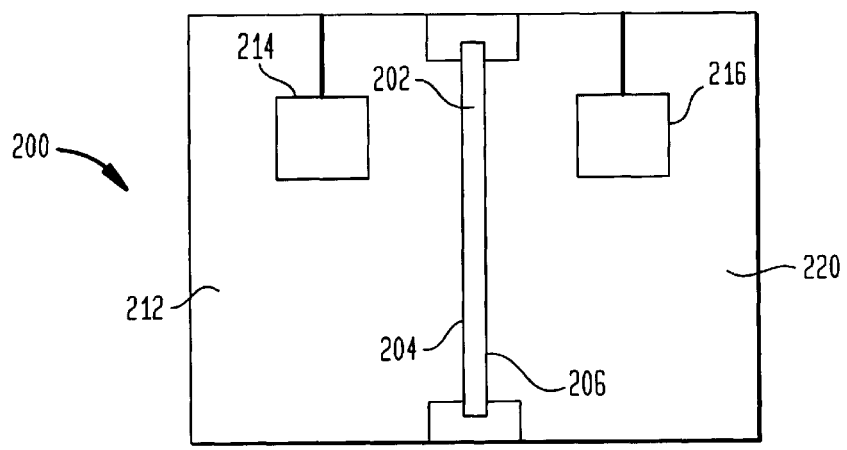
FIG. 2 is a schematic diagram of an alternate apparatus for electrochemically forming an oxide in accordance with the present invention.

Referring to FIG. 2, an alternate embodiment of the present invention includes apparatus 200 which also includes an electrochemical cell. A wafer 202 includes a front surface 204 and a back surface 206. Front surface 204 is exposed to an oxidation chamber 212 which includes an electrolyte in an aqueous solution, for example, $H_2SO_4$ in water. An inert electrode 214 is disposed in chamber 212 for providing a first potential to chamber 212 and therefore front surface 204 of wafer 202. Back surface 204 makes contact to a second electrode 216 through an electrolyte in an aqueous solution, for example, HF in water within a half cell or chamber 220. This provides an electrical contact to back surface 206 of wafer 202 and creates a second potential voltage to activate the reaction according to EQ. 1 above. Liquid in chamber 220 is sealed off from liquid in chamber 212.

As mentioned, the reaction of EQ. 1 takes place on exposed p-type doped silicon (i.e., p-doped silicon substrate). In one embodiment, this permits for SacOx formation if differently p-doped portions are provided on a semiconductor device. Examples for application of an anodic SacOx in accordance with the present invention are described with reference to FIGS. 3–6.

Figure 3:
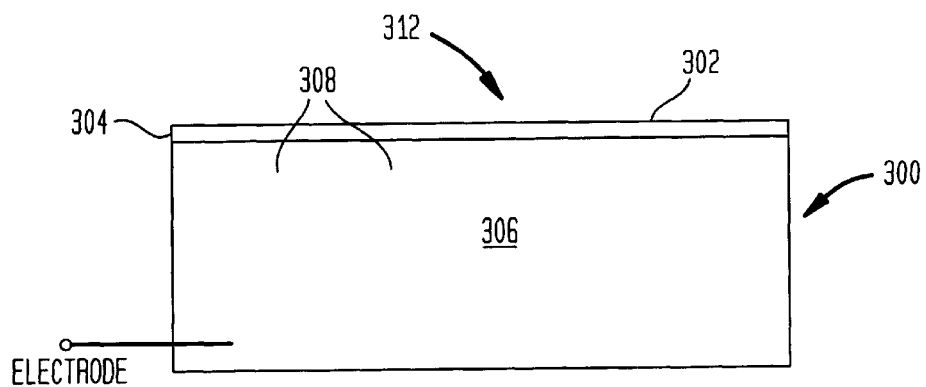
FIG. 3 is a cross-sectional view of a semiconductor substrate employing a sacrificial oxide as a shield, the sacrificial oxide layer being formed in accordance with the present invention.

Referring to FIG. 3, a SacOx layer 302 may be employed as a protecting film for gate oxide formation for device transistors on a semiconductor chip 300. Prior to SacOx formation, a surface 304 is etched and cleaned to expose bare Si of a silicon substrate 306 on regions 308 for active areas. Then, a thin SacOx layer 302 is formed (preferably about 6 nm in thickness, other thicknesses are contemplated) to minimize defect generation during the subsequent high energy ion implantations which are required to form n/p/n junctions of devices formed using active area regions. SacOx layer 302 is formed by connecting substrate 306 to an electrode as described with reference to FIGS. 2 and 3. Chip 300 is now submerged in an electrolytic solution 312, and a potential difference is provided between substrate 306 and solution 312. In this way, an oxide layer 302 is formed. After removal of SacOx layer 302 (preferably by a wet etch), an undamaged Si-surface remains which is suitable for a gate oxide formation.

Figure 4:
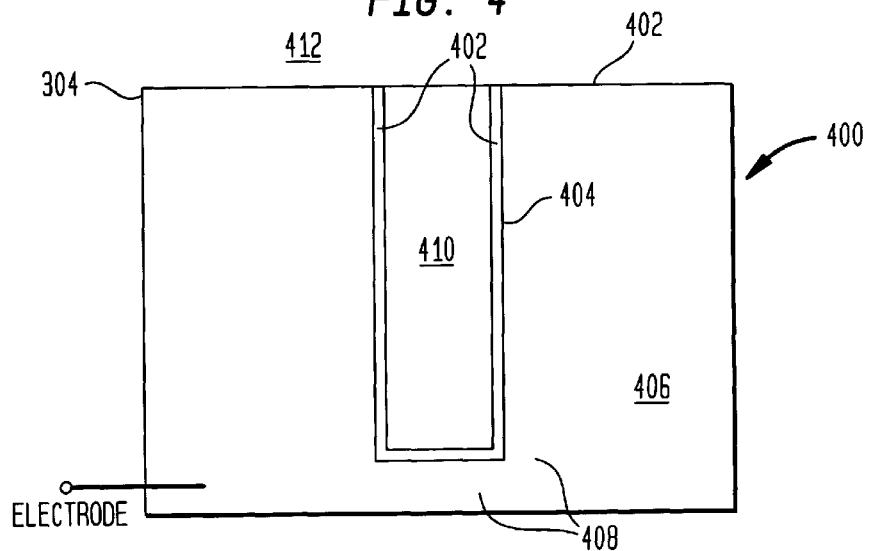
FIG. 4 is a cross-sectional view of a memory cell showing a deep trench formed in a substrate having an oxide formed and etched in the trench to smooth the surface of the trench in accordance with the present invention.

Referring to FIG. 4, an anodic SacOx layer 402 may be employed for sidewall smoothening of deep trench (DT) structures 404. DT capacitors are among the types of capacitors used in DRAM technology to store data. Deep trench capacitors are typically buried within a semiconductor substrate 406. These DT structures 404 are conventionally formed by an anisotropic dry etch process such as reactive ion etching (RIE). This RIE process may result in a rough surface which may cause reliability problems (electric breakdown) of a dielectric material which is used between a buried plate region 408 and a storage node region 410 of DT 404.

This problem becomes more severe as the thickness of the dielectric material is reduced. For roughness reduction an anodic SacOx layer 402 is formed on the DT sidewalls and subsequently stripped by a wet etch process. This leaves a smoother surface than the conventional processes. A cross-sectional view of a semiconductor memory chip 400 is shown for forming a smooth surface in a deep trench 404. Substrate 406 is attached to an electrode as described above with reference to FIGS. 2 and 3. Chip 400 is now submerged in an electrolytic solution 412, and a potential difference is provided between substrate 406 and solution 412. In this way, an oxide layer 402 is formed which is wet etched to form a smooth surface.

Figure 5:
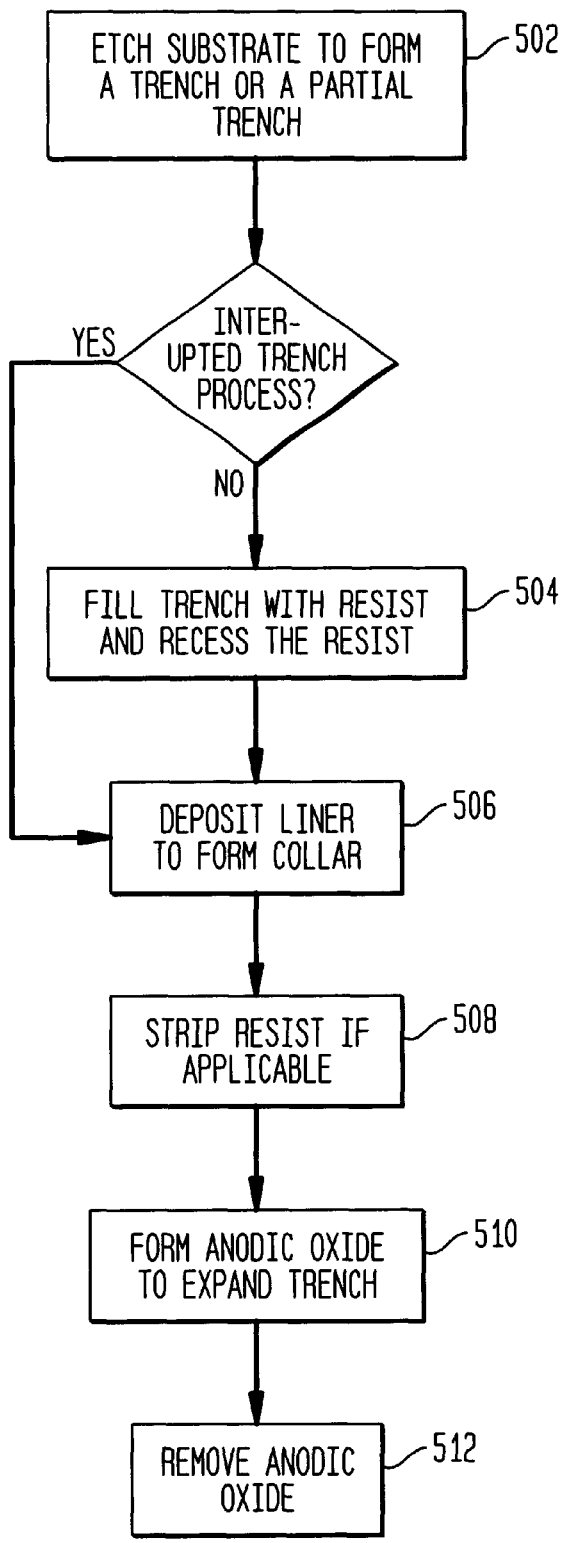
FIG. 5 is a flow diagram for forming a bottle shaped trench using a sacrificial oxide formed in accordance with the present invention.

Referring to FIG. 5, an anodic SacOx layer may be employed in various deep trench (DT) formation processes. For example, a DT bottle shape formation process includes the following steps. In a block 502, a conventional DT Si etch or interrupted DT etch, i.e. etch of collar portion only is performed. For a conventional deep trench etch, the full depth of the deep trench is etched in a single process. For an interrupted deep trench etch, only an upper portion of the trench is etched out which is used to form a collar in block 506. If an interrupted collar etch is performed the process path goes to block 506. Otherwise the process goes to block 504.

In block 504, a resist fill with a subsequent resist recess is performed to expose a top (collar) portion of the deep trench. In block 506, a liner deposition is performed which lines the deep trench sidewalls and is deposited on the recessed resist (of block 504). The portion of the liner on the resist is subsequently opened with a liner open etch process. In the case of an interrupted deep trench etch, in block 502, the resist material is not deposited as in block 504. Instead, the deep trench is etched to a first the DT etch depth (block 502) and the liner is deposited to form a collar in the upper portion of the deep trench (block 506). The remaining depth for the deep trench is now continued and block 508 is skipped for the interrupted etch process.

In block 508, for the conventional deep trench etch process the remaining resist is stripped. In block 510, in accordance with the present invention, an anodic oxide layer is formed in a bottom portion of the deep trench to consume a desired amount of silicon from the sidewalls of the deep trench (from the substrate). That is, the sidewalls at the bottom of the deep trench are to be expanded outward to form the bottle shaped trench by consuming portions of the substrate. In block 512, an oxide wet etch (for example, an HF etch) is performed to remove the anodic oxide layer resulting in a widening of the DT in the bottom portion. Further processing is continued as is known in the art.

Figure 6:
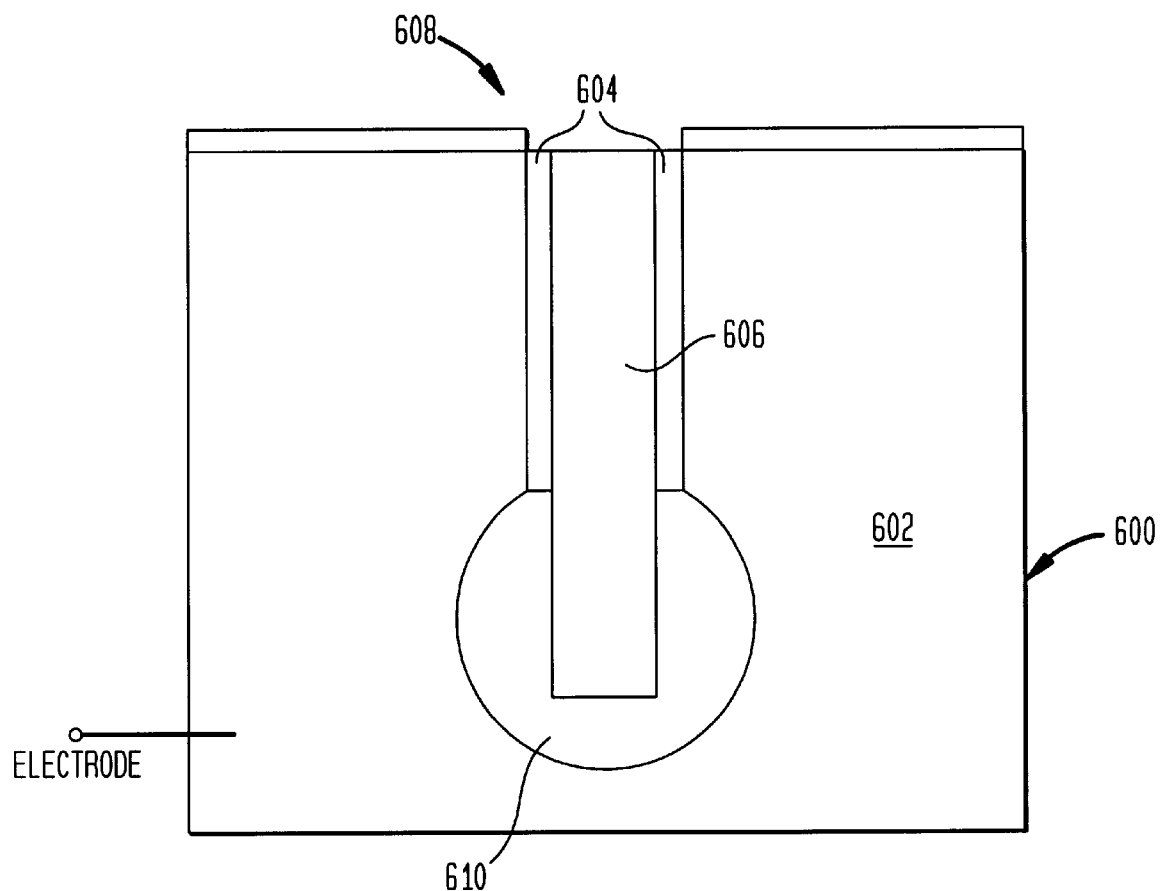
FIG. 6 is a cross-sectional view of a memory cell showing a deep trench formed in accordance with the flow diagram of FIG. 5.

Referring to FIG. 6, a cross-sectional view of a semiconductor memory chip 600 is shown for forming a bottle shaped deep trench as described for block 510 above. A silicon substrate 602 is attached to an electrode as described above with reference to FIGS. 2 and 3. A dielectric collar 604 has been formed in a trench 606 in accordance with blocks 502 to 508 described above. Chip 600 is now submerged in an electrolytic solution 608, and a potential difference is provided between substrate 602 and solution 608. In this way, a silicon region 610 is subjected to oxidizing to form an oxide which is removed by a wet etching process to form a bottle shaped trench.

The present invention provides many advantages over the prior art. These advantages may include at least the following over conventional high temperature SacOx formation.

1. Low thermal budget. The process may be performed at room temperature. Therefore, less stress is induced to the trench/device interface resulting in improved VRT behavior.
2. Improved oxide thickness control. Since the thickness is directly given and self limited by the applied anodic potential better control of the process is provided and measurements may be taken less frequently or not at all.
3. Cheaper tools. The bath and electrodes are significantly cheaper to buy and to use than the conventional tools.
4. Smoothening of interfaces due to an E-field mechanism (high electric fields in topographic tips, edges or rough surfaces results in thicker oxides). For surface tips, high electric fields exist resulting in the formation of thicker oxides. After removing (stripping) the SacOx, a smoother surface results. This effect is known as electropolishing.
5. Higher etch rates. Higher etch rates of oxides formed in accordance with the present invention, reduce undesired etch impact on exposed structures.

Additionally, the present invention is not limited to SacOx layers, but is applicable to any anodic deposition process. Other processes and steps for semiconductor fabrication may be employed which utilize the concept of the present invention. These processes and steps are within the purview of this invention. Further, many applications may be found for the SacOx layer in accordance with the present invention. For example, the SacOx layer may be used for or as surface protection, a stress relief, an etch stop layer, smoothing of a surface, masking layers, structure formation and/or channeling inhibition during ion implantation.

Having described preferred embodiments for a low temperature sacrificial oxide formation (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for depositing a sacrificial oxide for fabricating a semiconductor device comprising the steps of:

preparing p-doped silicon regions on a semiconductor wafer for depositing a sacrificial silicon oxide on the p-doped silicon regions;

placing the wafer in an electrochemical cell such that a solution including electrolytes interacts with the p-doped silicon regions to form a sacrificial silicon oxide on the p-doped silicon regions when a potential difference is provided between the wafer and the solution; and processing the wafer using the sacrificial silicon oxide layer.

2. The method as recited in claim 1, further comprising the step of applying a voltage between the wafer and the solution to create the potential difference such that the voltage applied controls the thickness of the sacrificial silicon oxide.

3. The method as recited in claim 1, wherein the solution includes water.

4. The method as recited in claim 1, wherein the electrolyte includes an ionic compound.

5. The method as recited in claim 1, wherein the step of placing the wafer in an electrochemical cell includes the steps of:

placing the wafer in an electrochemical cell such that the wafer has an exposed surface area including the exposed p-doped silicon regions thereon; and providing a counter electrode in the solution having a substantially same exposed surface area as the exposed surface area of the wafer.

6. The method as recited in claim 5, wherein the step of placing the wafer in an electrochemical cell includes the step of sealing other than exposed areas of the wafer to prevent contact with the solution.

7. The method as recited in claim 1, wherein the step of placing the wafer in an electrochemical cell includes the step of placing the wafer in an electrochemical cell such that a front surface of the wafer including the exposed p-doped silicon regions is exposed to an oxidation chamber and a back surface of the wafer is exposed to a second solution which transfers a potential to the wafer to cause the potential difference.

8. The method as recited in claim 1, wherein the solution including electrolytes interacts with the p-doped silicon regions by:

reacting according to the reaction:

$Si + H_2O[?] \rightarrow SiO_2 + 4H^+ + 4e^-$ (EQ. 1).

9. The method as recited in claim 8, wherein the reaction occurs at about room temperature.

10. The method as recited in claim 1, wherein the step of processing includes the steps of:

etching a trench in a substrate of the semiconductor wafer wherein the surface has a first smoothness;

forming the sacrificial silicon oxide layer in the trench;

etching the sacrificial silicon oxide layer to form a surface smoother than the first smoothness.

11. The method as recited in claim 1, wherein the step of processing includes the steps of:

forming the sacrificial silicon oxide layer on a surface of a substrate of the semiconductor wafer; and shielding portions of the surface from dopants using the sacrificial silicon oxide layer.

12. The method as recited in claim 1, wherein the step of processing includes the steps of:

etching a trench in a substrate of the semiconductor wafer;

forming an oxide region in the trench;

etching the oxide region to expand the trench.

13. A method for electrochemically forming a sacrificial oxide comprising the steps of:

exposing p-doped portions of a silicon substrate;

placing the silicon substrate in an electrochemical cell, the electrochemical cell including a solution having electrolytes dissolved therein; and applying a first potential to the silicon substrate and a second potential to the solution to form a potential difference therebetween such that a sacrificial silicon oxide layer is electrochemically deposited on the exposed p-doped regions of the substrate;

processing the wafer using the sacrificial silicon oxide layer; and removing the sacrificial silicon oxide layer.

14. The method as recited in claim 13, wherein the potential difference is applied to control the thickness of the sacrificial silicon oxide layer.

15. The method as recited in claim 13, wherein the solution includes water.

16. The method as recited in claim 13, wherein the electrolyte includes an ionic compound.

17. The method as recited in claim 11, wherein the step of placing the silicon substrate in an electrochemical cell includes the steps of:

placing the silicon substrate in an electrochemical cell such that the substrate has an exposed surface area including the exposed the p-doped portions; and providing a counter electrode in the solution having a substantially same exposed surface area as the exposed surface area of the substrate.

18. The method as recited in claim 17, wherein the step of placing the silicon substrate in an electrochemical cell includes the step of sealing other than exposed areas of the substrate to prevent contact with the solution.

19. The method as recited in claim 13, wherein the step of placing the silicon substrate in an electrochemical cell includes the step of placing the silicon substrate in an electrochemical cell such that a front surface of the substrate including the p-doped portion is exposed to an oxidation chamber and a back surface of the wafer is exposed to a second solution which transfers the first potential to the substrate to cause the potential difference.

20. The method as recited in claim 13, wherein the solution including electrolytes interacts with the p-doped portions by:

reacting according to the reaction:

$Si + H_2O[?] \rightarrow SiO_2 + 4H^+ + 4e^+$ (EQ. 1).

21. The method as recited in claim 20, wherein the reaction occurs at about room temperature.

22. The method as recited in claim 13, further comprising the step of adjusting a thickness of the sacrificial silicon oxide by adjusting the potential difference.

23. The method as recited in claim 13, further comprising the step of annealing the sacrificial oxide to densify the sacrificial silicon oxide.

24. The method as recited in claim 13, wherein the step of processing includes the steps of:
   etching a trench in a substrate of the semiconductor wafer wherein the surface has a first smoothness; and
   forming the sacrificial silicon oxide layer in the trench; and the step of removing includes the step of:
   etching the sacrificial silicon oxide layer to form a surface smoother than the first smoothness.

25. The method as recited in claim 13, wherein the step of processing includes the steps of:
   forming the sacrificial silicon oxide layer on a surface of a substrate of the semiconductor wafer; and
   shielding portions of the surface from dopants using the sacrificial silicon oxide layer.

26. The method as recited in claim 13, wherein the step of processing includes the steps of:
   etching a trench in a substrate of the semiconductor wafer;
   forming an oxide region in the trench;
   etching the oxide region to expand the trench.

\* \* \* \* \*